United States Patent
Itami et al.

(10) Patent No.: US 10,211,355 B2
(45) Date of Patent: Feb. 19, 2019

(54) SOLAR CELL MODULE

(71) Applicant: Solar Frontier K.K., Tokyo (JP)

(72) Inventors: Takehiro Itami, Tokyo (JP); Hiroshi Igoshi, Tokyo (JP)

(73) Assignee: SOLAR FRONTIER K.K., Tokyo (JP)

( * ) Notice: Subject to any disclaimer, the term of this patent is extended or adjusted under 35 U.S.C. 154(b) by 0 days.

(21) Appl. No.: 14/655,832

(22) PCT Filed: Dec. 17, 2013

(86) PCT No.: PCT/JP2013/083739
§ 371 (c)(1),
(2) Date: Jun. 26, 2015

(87) PCT Pub. No.: WO2014/103794
PCT Pub. Date: Jul. 3, 2014

(65) Prior Publication Data
US 2016/0197218 A1 Jul. 7, 2016

(30) Foreign Application Priority Data
Dec. 27, 2012 (JP) ................................ 2012-283910

(51) Int. Cl.
*H01L 31/048* (2014.01)
*H02S 30/10* (2014.01)
*F24J 2/46* (2006.01)

(52) U.S. Cl.
CPC ............ *H01L 31/048* (2013.01); *H02S 30/10* (2014.12); *F24J 2/465* (2013.01); *F24J 2002/4676* (2013.01); *Y02E 10/50* (2013.01)

(58) Field of Classification Search
CPC .................................................. H01L 31/048
See application file for complete search history.

(56) References Cited

U.S. PATENT DOCUMENTS 4,692,557 A * 9/1987 Samuelson ....... B32B 17/10678
136/251

FOREIGN PATENT DOCUMENTS

| JP | 3040582 B2 | 5/2000 |
| JP | 2000-174311 A | 6/2000 |

(Continued)

OTHER PUBLICATIONS

Machine Translation of JP 2003-229591, accessed Jun. 26, 2016.*
(Continued)

*Primary Examiner* — Shannon M Gardner
(74) *Attorney, Agent, or Firm* — Westerman, Hattori, Daniels & Adrian, LLP

(57) ABSTRACT

There is provided a solar cell module with good weather resistance (moisture resistance) and power generation efficiency.

A solar cell module 1 comprises a solar cell panel 10 configured to include a solar cell element 12 and a front surface protective member 14 disposed on a light receiving surface side of the solar cell element 12; a first coating member 22 having moisture resistance that is stuck to the solar cell panel 10 with adhesive such that at least a surface S1 of the front surface protective member 14 and a side end surface S3 of the solar cell panel 10 are covered continuously at a peripheral edge of the solar cell panel 10; and a second coating member 32 covering at least an end A1 of the first coating member 22 on the front surface protective member 14 side while being in contact with the surface S1 of the front surface protective member 14.

3 Claims, 7 Drawing Sheets

(56) References Cited

FOREIGN PATENT DOCUMENTS

| JP | 2001-60701 A | 3/2001 |
| JP | 2002-141543 A | 5/2002 |
| JP | 2003-229591 A | 8/2003 |
| JP | 2012-84721 A | 4/2012 |
| JP | 2012-204459 A | 10/2012 |
| WO | 2012/043131 A1 | 4/2012 |
| WO | 2012/127742 A1 | 9/2012 |

OTHER PUBLICATIONS

Extended (Supplementary) European Search Report (EESR) dated Jun. 29, 2016, issued in counterpart European Patent Application No. 13866941.1. (7 pages).

International Search Report dated Jan. 21, 2014, issued in corresponding application No. PCT/JP2013/083739 (2 pages).

\* cited by examiner

SOLAR CELL MODULE

TECHNICAL FIELD

The present invention relates to a solar cell module.

BACKGROUND ART

A solar cell module typically has a configuration in which a solar cell element is sealed with a sealant (a sealing resin such as EVA or PVB) between a front surface protective member (glass, etc.) and a rear surface protective member (resin sheet, etc.).

Since a solar cell module is installed outdoors, the reliability of its weather resistance is of importance. A known structure that can ensure, in particular, moisture resistance of a solar cell module is the one which is obtained by sealing a peripheral edge of a solar cell module by covering it in a frame shape using metal foil tape with adhesive (see, for example, Patent Document 1).

CITATION LIST

Patent Documents

Patent Document 1: JP 2002-141543 A

SUMMARY OF INVENTION

Technical Problem

However, in the case of a structure in which a peripheral edge of a solar cell module is covered with metal foil tape with adhesive, the adhesive of the tape may be exposed on a light receiving surface of the solar cell module at the ends of the metal foil tape extending to the surface of a front surface protective member (the light receiving surface) of the solar cell module. Further, during long-term outdoor use of such a solar cell module, foreign matters such as dirt and dust may be attached to the exposed adhesive and the contamination by the foreign matters may gradually expand towards the center of the light receiving surface. This may cause the reduction of the area of the light receiving surface thereby to reduce the power generation efficiency.

In view of the above, the present invention has been made and one of the objects of the present invention is to provide a solar cell module good in weather resistance (moisture resistance) and power generation efficiency.

Solution to Problem

To overcome the problem, one aspect of the present invention provides a solar cell module comprising: a solar cell panel configured to include a solar cell element and a front surface protective member disposed on a light receiving surface side of the solar cell element; a first coating member having moisture resistance that is stuck to the solar cell panel with adhesive such that at least a surface of the front surface protective member and a side end surface of the solar cell panel are covered continuously at a peripheral edge of the solar cell panel; and a second coating member covering at least an end of the first coating member on the front surface protective member side while being in contact with the surface of the front surface protective member.

According to another aspect of the invention, the second coating member comprises a recess between a part where the second coating member is in contact with the surface of the front surface protective member and the end of the first coating member, and the recess is provided with an adhesive for sticking the second coating member to the solar cell panel.

According to yet another aspect of the invention, the second coating member is a resin gasket.

According to another aspect of the invention, projections and recesses are formed on an outer surface of the second coating member.

According to yet another aspect of the invention, the solar cell panel further comprises a rear surface protective member disposed on a rear surface side of the solar cell element.

According to another aspect of the invention, the first coating member is metal and an end of the first coating member on the rear surface protective member side is covered with the second coating member.

According to yet another aspect of the invention, the first coating member is metal and at least a part of an end of the first coating member on the rear surface protective member side is exposed from the second coating member.

Advantageous Effects of Invention

According to the present invention, there can be provided a solar cell module which has good weather resistance (moisture resistance) and power generation efficiency.

DESCRIPTION OF EMBODIMENTS

Figure 1A:
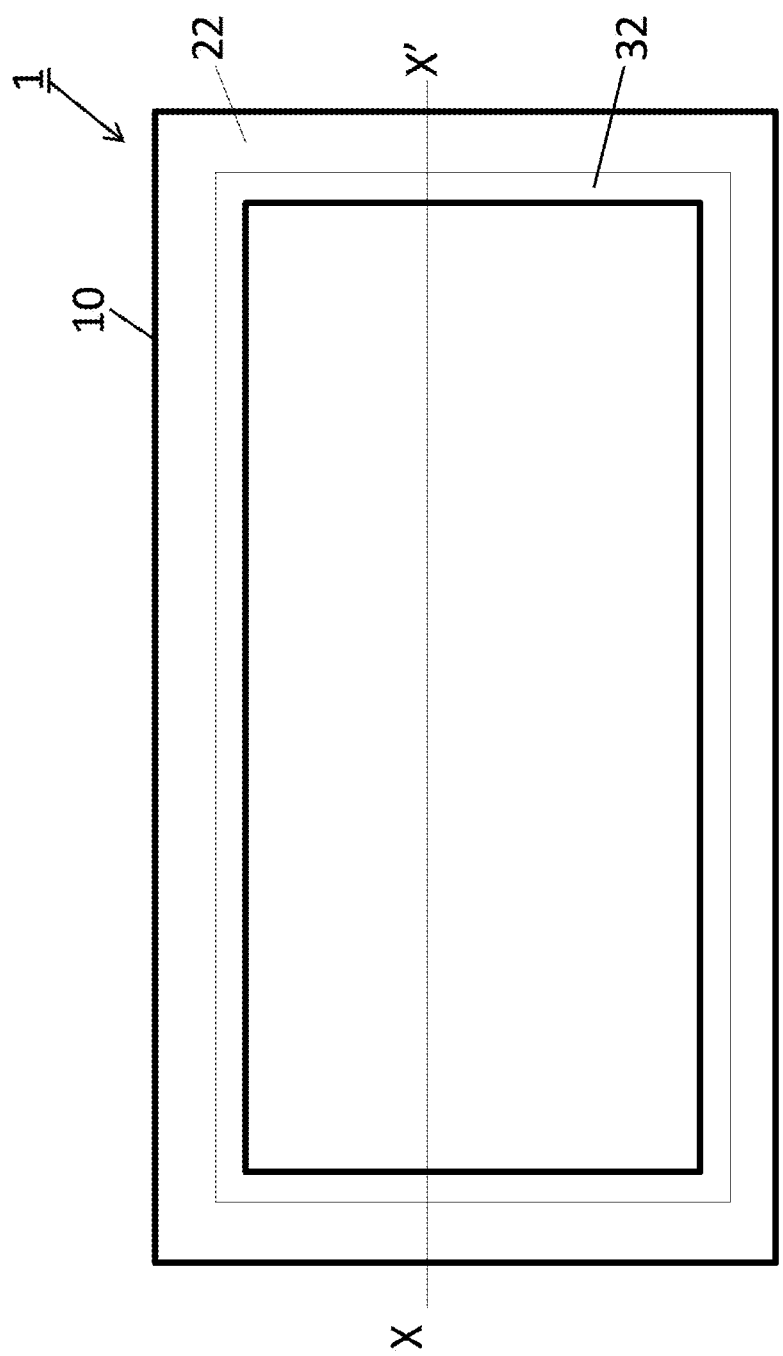
FIG. 1A shows a front view illustrating the overall configuration of a solar cell module according to a first embodiment of the present invention.

Embodiments of the present invention will be described below in detail with reference to drawings. It should be appreciated that each drawing is provided for ease of understanding of the present invention and may not be drawn to scale; the shape, dimension, proportion, positional relation, or the like of elements shown in the drawings may be intentionally exaggerated or modified.

First Embodiment

Figure 1B:
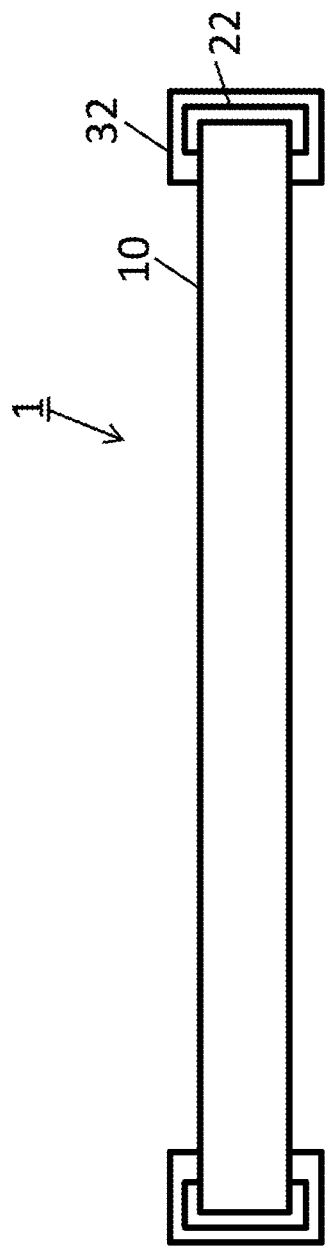
FIG. 1B shows a cross-section view illustrating the overall configuration of a solar cell module according to a first embodiment of the present invention.

FIGS. 1A and 1B show a front view and a cross-section view, respectively, illustrating the overall configuration of a solar cell module 1 according to a first embodiment of the present invention. Front view (FIG. 1A) presents the solar cell module 1 as seen from its light receiving surface side, and cross-section view (FIG. 1B) represents the cross section of the solar cell module 1 taken from the line X-X' in the front view.

The solar cell module 1 comprises a solar cell panel 10 that is rectangular in planar view, a first coating member 22 that covers a peripheral edge of the solar cell panel 10, and a second coating member 32 that covers at least ends of the first coating member 22. Herein, the peripheral edge of the solar cell panel 10 refers to the four sides and their vicinity of the rectangular solar cell panel 10 in planar view. In this embodiment, the first coating member 22 is completely covered in its entirety with the second coating member 32 and is not exposed to the outside.

Figure 2:
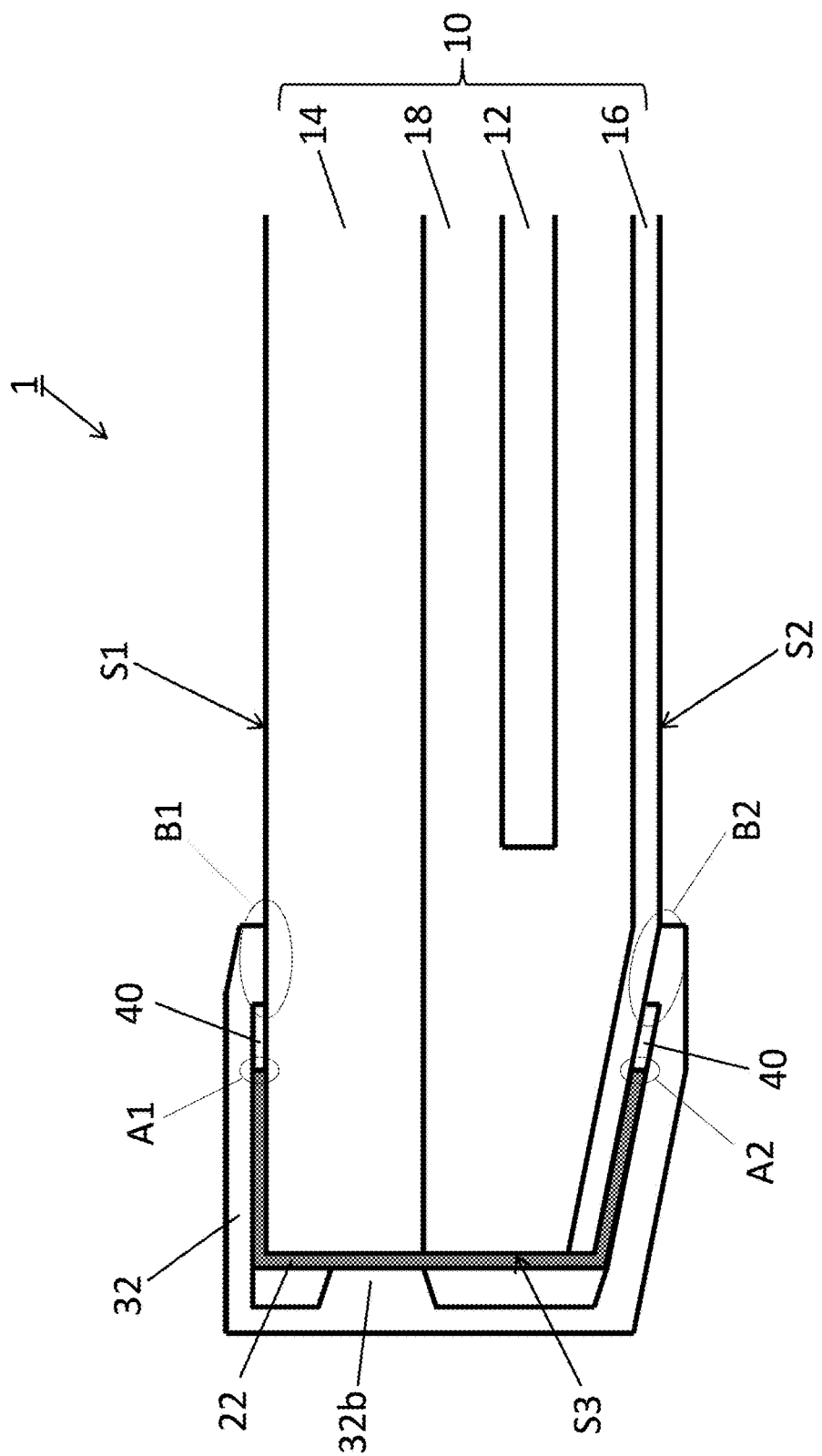
FIG. 2 is a cross-section view illustrating an enlarged view of a detailed structure in the vicinity of the peripheral edge of the solar cell module.

FIG. 2 is a cross-section view illustrating an enlarged view of a detailed structure in the vicinity of the peripheral edge of the solar cell module 1. In the figure, the upper side corresponds to the light receiving surface side, and the lower side corresponds to a rear surface side. Referring to this figure, the structure of the solar cell module 1 will be described in more detail below.

The solar cell panel 10 comprises a solar cell element 12 that generates electricity by receiving irradiation of light on the light receiving surface, a front surface protective member 14 that protects the solar cell element 12 at the light receiving surface side, a rear surface protective member 16 that protects the solar cell element 12 at the rear surface side, and a sealant layer 18 that seals the solar cell element 12 between the front surface protective member 14 and the rear surface protective member 16.

An example of the solar cell element 12 is a thin-film-based solar cell element obtained by forming a thin-film photoelectric conversion element on a substrate such as of glass, metal, or resin, or a crystal-based solar cell element obtained by connecting a plurality of photoelectric conversion elements in series or parallel, each of which is configured with monocrystalline or polycrystalline silicon substrates.

The front surface protective member 14 is a transparent protective plate made of reinforced glass or resin. The rear surface protective member 16 is, for example, a weather resistant sheet obtained by sandwiching an aluminum foil with PET (Polyethylene Terephthalate) resin, and serves to prevent moisture or the like from adhering to the sealant layer 18. A grass plate or a resin sheet or plate may also be used as the rear surface protective member 16. The sealant layer 18 is a resin layer having a certain level of weather resistance, such as EVA (Ethylene Vinyl Acetate), PVB (Poly Vinyl Butyral), or olefin resins, and serves as a protector for the solar cell element 12 from the moisture environment and also bonds the front surface protective member 14 and the rear surface protective member 16 to the solar cell element 12.

The first coating member 22 has enough moisture resistance to prevent moisture penetration. The first coating member 22 extends from a side end surface S3 of the solar cell panel 10 to a surface S1 of the front surface protective member 14 and a surface S2 of the rear surface protective member 16 and is adhered to the peripheral edge of the solar cell panel 10 with an adhesive (not shown). That is, at the peripheral edge of the solar cell panel 10, the whole of the side end surface S3, a part of the surface S1 of the front surface protective member 14 (the vicinity of the side end surface S3), and a part of the surface S2 of the rear surface protective member 16 (the vicinity of the side end surface S3) of the solar cell panel 10 are covered integrally and continuously with the first coating member 22 having moisture resistance. By virtue of this structure, moisture is prevented from entering into the solar cell panel 10 from the side end surface S3 through the sealant layer 18.

As the first coating member 22, for example, a thin metal in the form of tape or sheet (e.g., metal foil) or a resin tape or sheet having high moisture resistance may be used. Alternatively, a tape or sheet of a composite material obtained by bonding a plurality of materials such as metals and resins together may be used. Further, as an adhesive for the bonding of the first coating member 22, for example, a butyl adhesive or silicone adhesive may be used. As a more preferable embodiment, a butyl adhesive is placed on the surface of a tape metal foil as an adhesive layer, which is favorable in terms of both moisture resistance and workability. More specifically, when an adhesive layer is formed of a butyl adhesive on the surface of a metal foil, the adhesive layer adheres to the peripheral edge of the solar cell panel 10 and the metal foil can be attached to the solar cell panel 10 with ease.

The second coating member 32 is attached to the solar cell panel 10 so as to completely cover at least an end A1 of the first coating member 22 at the peripheral edge of the solar cell panel 10. More specifically, the second coating member 32 extends from the surface S1 of the front surface protective member 14 via the side end surface S3 of the solar cell panel 10 to the surface S2 of the rear surface protective member 16. Further, on the front surface protective member 14 side, an end B1 of the second coating member 32 is located at an inner position on the solar cell panel 10 (a position closer to the center of the light receiving surface of the solar cell panel 10), compared to the position of an end A1 of the first coating member 22, and contacts the surface S1 of the front surface protective member 14. Similarly, on the rear surface protective member 16 side, an end B2 of the second coating member 32 is located at an inner position of the solar cell panel 10 (a position closer to the center of the rear surface of the solar cell panel 10), compared to an end A2 of the first coating member 22, and contacts the surface S2 of the rear surface protective member 16.

Thus, by forming the second coating member 32 such that it covers the first coating member 22, the ends of the solar cell panel 10 can be protected by the second coating member 32. Further, in a case where the solar cell module 1 is installed on an installation surface, e.g., roof, by using a frame or mounting brackets for installation (e.g., clamp), the ends of the solar cell panel 10 can be also protected by virtue of the solar cell module 1 having the second coating member 32.

Furthermore, the second coating member 32 is configured to have a recess between a part where the end B1 is in contact with the surface S1 of the front surface protective member 14 and the end A1 of the first coating member 22 and to have another recess between a part where the end B2 is in contact with the surface S2 of the rear surface protective member 16 and the end A2 of the first coating member 22. These recesses are filled with an adhesive 40. The second coating member 32 is fixed to the solar cell panel 10 by the adhesive 40. Here, the second coating member 32 is preferably a resin gasket made of thermoplastic elastomer, but this is not the sole example that can be used as the second coating member 32 in the present invention; it may be a plastic member made of vinyl chloride, ABS resin, acrylic resin, or the like, or it may also be a frame made of a metal such as aluminum. Furthermore, the second coating member 32 may have a double-layered structure in which the inner layer (in contact with the first coating member 22) and the outer layer are formed of different materials. In this case, a flame-retardant or self-extinguishing material may be used for the outer layer and a material with good adhesion to the adhesive 40 may be used for the inner layer to provide a second coating member 32 that is hard to burn and is hard to come off. Further, as the adhesive 40, for example, a silicone adhesive or a butyl adhesive can be used.

In this way, the end A1 of the first coating member 22 on the front surface protective member 14 side is covered with the second coating member 32, and the end B1 of the second coating member 32 on the front surface protective member 14 side is in contact with the surface S1 of the front surface protective member 14, and thus the end A1 of the first coating member 22 is not exposed to the outside air, which in turn enables to prevent foreign matters from adhering to the end A1 of the first coating member 22 (although the adhesive for sticking the first coating member 22 to the solar cell panel 10 might be exposed at the end A1, as is stated above). Therefore, a situation can be avoided in which the contamination due to foreign matters expands on the light receiving surface of the solar cell panel 10 thereby to lower the power generation efficiency.

Further, penetration of moisture into the inside of the solar cell panel 10 can be further suppressed by the adhesion 40 being filled in the recesses that are formed respectively between the ends A1, A2 of the first coating member 22 and the ends B1, B2 of the second coating member 32. More specifically, a possible pathway through which moisture can reach the side end surface S3 of the sealant layer 18 may be, for example, a route that goes along the boundary surface between the first coating member 22 and the front surface protective member 14 or the boundary surface between the first coating member 22 and the rear surface protective member 16; however, the entrance to the pathway is blocked by the adhesion 40 to prevent moisture from moving into this pathway, whereby the moisture penetration into the inside of the solar cell panel 10 may be even further suppressed.

It should be noted that, the adhesive 40 is prevented from leaking onto the light receiving surface of the solar cell panel 10 beyond the end B1 of the second coating member 32 because the end B1 of the second coating member 32 contacts the surface S1 of the front surface protective member 14. Accordingly, there is no possibility that foreign matters will stick to the adhesive 40, and thus filling of the adhesive 40 into the recess between the ends A1 and B1 does not lead to the disadvantage of contamination by foreign matters on the light receiving surface of the solar cell panel 10 and the resulting reduction in power generation efficiency.

Also, in a case where the first coating member 22 is made of metal, covering the end A2 on the rear surface protective member 16 side with the second coating member 32 can prevent the first coating member 22 from being touched by hand or the like by mistake, whereby electric shock or the like from the first coating member 22 can be avoided.

An adhesive may be filled between the first coating member 22 and the second coating member 32 at a part of the side end surface S3 of the solar cell panel 10. This can make stronger the adhesion of the second coating member 32 to the solar cell panel 10 via the first coating member 22. In addition, by providing a projection 32b on an inner surface of the second coating member 32 at the side end surface S3, a gap between the first coating member 22 and the second coating member 32 at the side end surface S3 can be kept in a certain size. This makes it possible to control a filling amount of adhesion into the gap to be kept constant.

Figure 3A:
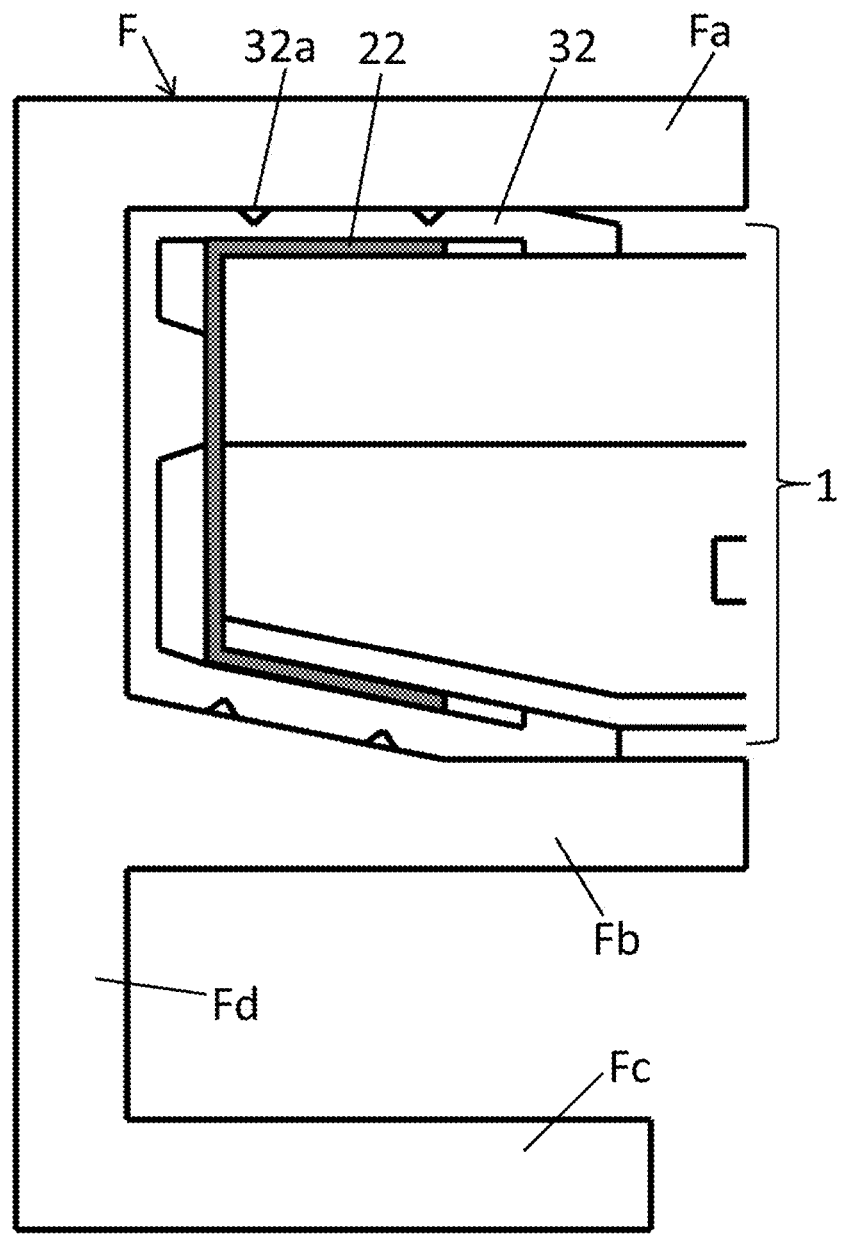
FIGS. 3A and 3B are cross-section views of a structure in which a solar cell module is mechanically supported at its outer periphery by a frame.
Figure 3B:
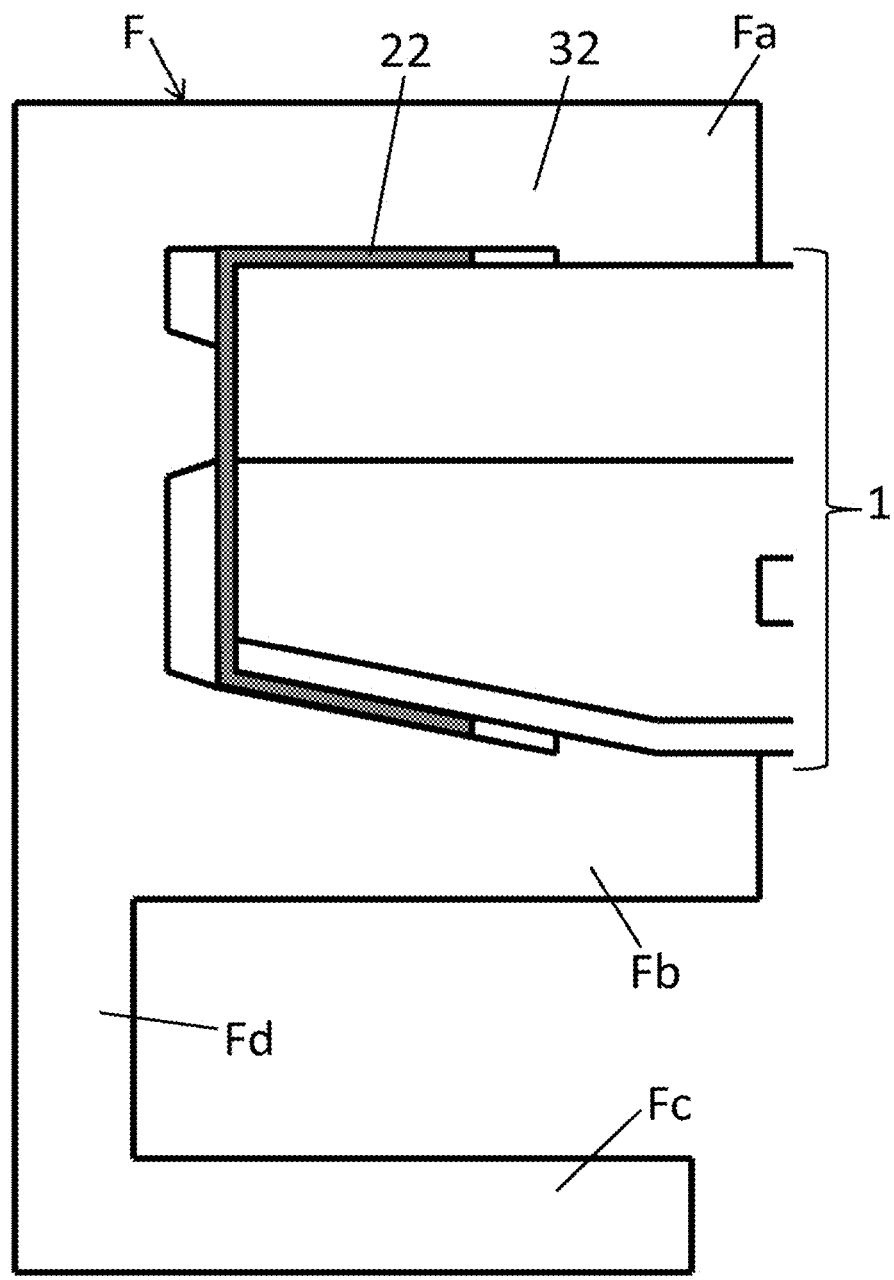

FIGS. 3A and 3B are cross-section views of a structure in which a solar cell module is mechanically supported at its outer periphery by a frame.

In FIG. 3A, a frame F is configured to include a first flange Fa, a second flange Fb, a third flange Fc, and a side wall Fd, and the peripheral edge which is covered with the second coating member 32 of the solar cell module 1 is inserted between the first flange Fa and the second flange Fb to fix the solar cell module 1 with the frame F. In this configuration, by using a resin gasket as the second coating member 32, adhesion and fixation of the solar cell module 1 and the frame F (first flange Fa and second flange Fb) can be improved. As for a gasket, a gasket of a thermoplastic elastomer, for example, can be used in the present invention, but this is not the sole example and a gasket of plastic composed of vinyl chloride, ABS resin, acrylic resin, or the like may also be used. Further, a plurality of projections and recesses 32a are formed on the surface of the second coating member 32 which is in contact with the first flange Fa or the second flange Fb, in other words, on the outer surface of the second coating member 32 (the surface opposite to the one in contact with the first coating member 22). As shown, the projections and recesses 32a are a plurality of V-shaped grooves, for example. The presence of these projections and recesses 32a can increase the friction between the solar cell module 1 and the frame F, thereby to further strengthen the fixation between them.

In FIG. 3B, although the configuration of a frame F is the same as that shown in FIG. 3A, a part of the frame F, which consists of a first flange Fa and a part of side wall Fd (the part between the first flange Fa and a second flange Fb) as well as the second flange Fb, serves as a second coating member 32. That is, in this configuration this part of frame F is also used as a second coating member 32, whereby the number of components can be reduced.

As for the material of the frame F, various materials including metals and resins may be used. In addition, the shape of the frame F shown in the figure is an example and not limited thereto.

Second Embodiment

Figure 4:
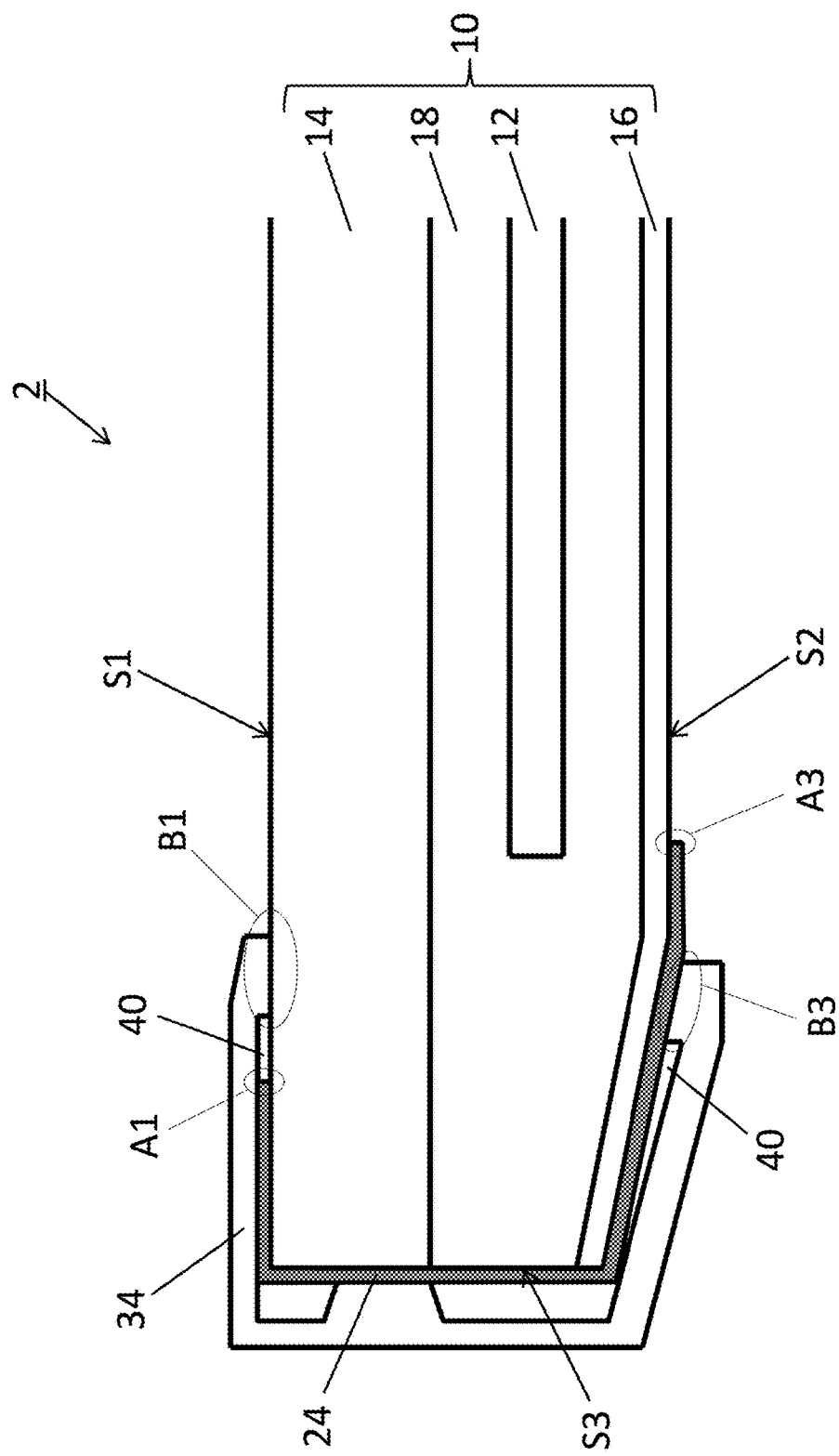
FIG. 4 is a cross-section view illustrating a detailed structure in the vicinity of the peripheral edge of a solar cell module according to a second embodiment of the present invention.

FIG. 4 is a cross-section view illustrating the overall configuration of a solar cell module 2 according to a second embodiment of the present invention. In this figure, the same symbols as used in the first embodiment indicate the same elements, explanations for which are omitted in the following.

The second embodiment differs from the first embodiment in the positional relationship between a first coating member 24 and a second coating member 34 on the rear surface side of a solar cell module 2.

That is, an end B3 of the second coating member 34 on the rear surface protective member 16 side is located at an outer position on a solar cell panel 10 (a position far from the center of the rear surface of the solar cell panel 10), compared to an end A3 of the first coating member 24 on the rear surface protective member 16 side, and as a result, the end A3 of the first coating member 24 is exposed from the second coating member 34. According to this configuration, this exposed part of the first coating member 24 can be utilized as an earth terminal when the first coating member 24 used is made of metal.

It should be noted that, although an adhesive which sticks the first coating member 24 to the solar cell panel 10 might be out on the exposed end A3 of the first coating member 24 and foreign matters might adhere to it, this will not affect the power generation efficiency because this occurs on the rear surface of the solar cell panel 10.

Although embodiments of the present invention have been described above, it will be appreciated that the invention is not limited to these and various modifications may be made without departing from the scope of the disclosure.

Figure 5:
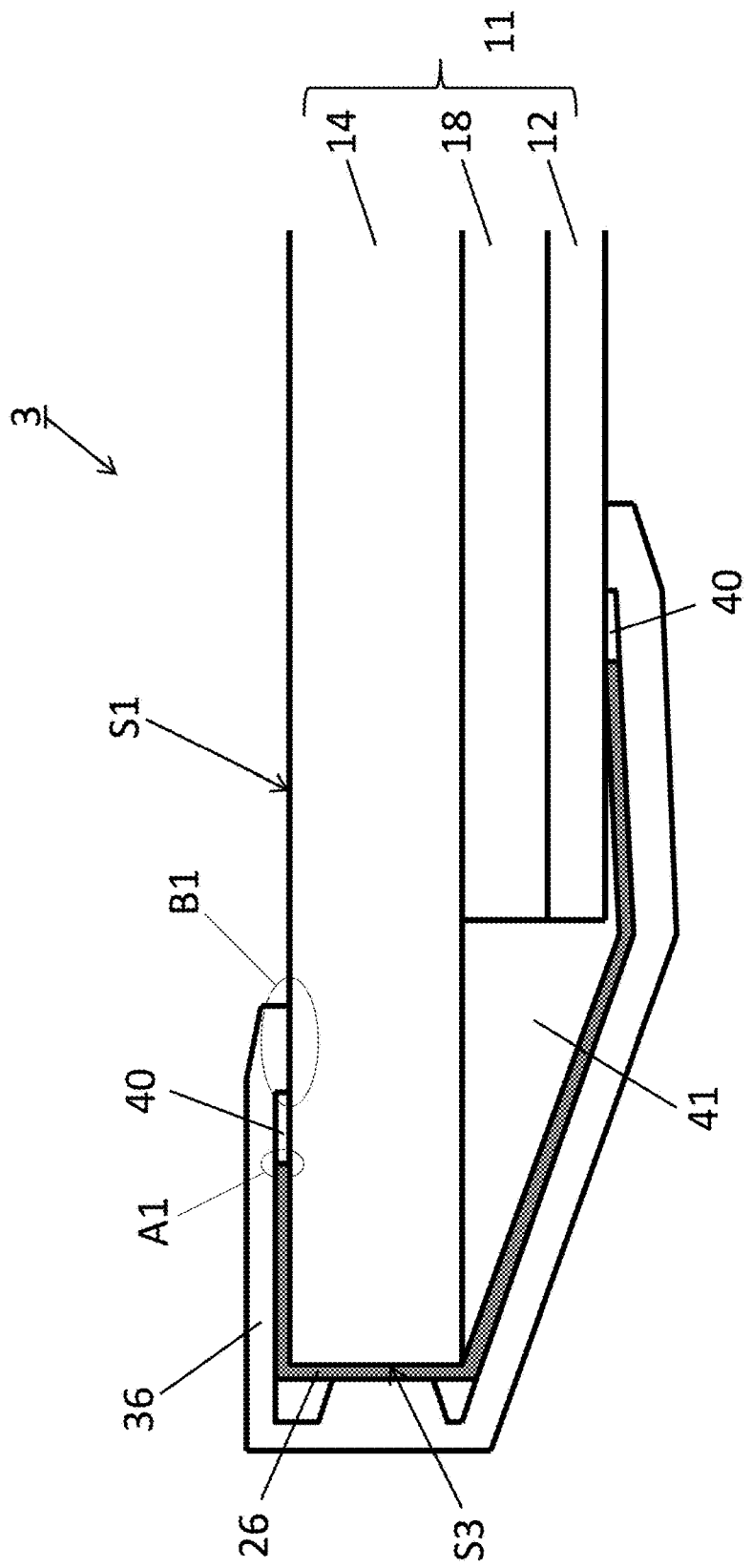
FIG. 5 is a cross-section view illustrating a detailed structure in the vicinity of the peripheral edge of a solar cell module according to a modification of the present invention.

For example, when a solar cell element 12 is a thin-film-based solar cell element, as shown in FIG. 5, a solar cell panel may be configured such that a sealant layer 18 is provided between the light receiving surface of the solar cell element 12 and a front surface protective member 14; namely it may be configured such that a rear surface protective member is not provided and the substrate of the solar cell element 12 is exposed on the rear surface of the panel 11. In other words, the substrate of the solar cell element 12 may be viewed as a rear surface protective member. In this figure, the structure of the light receiving surface side of a solar cell module 3 is the same as that in the first and second embodiments. On the other hand, on the rear surface side of the solar cell module 3, a first coating member 26 extends from a side end surface S3 of the solar cell panel 11 to the rear surface of the solar cell element 12 and is adhered to the solar cell panel 11. Further, on the module's rear surface side, a second coating member 36 extends from the side end surface S3 of the solar cell panel 11 to the rear surface of the solar cell element 12, and the end of the second coating member 36 is located at an inner position of the solar cell panel 11 (a position closer to the center of the rear surface of the solar cell panel 11), compared to the end of the first coating member 26, and contacts the rear surface of the solar cell element 12. As a result, the end of the first coating member 26 on the rear surface side is covered with the second coating member 36. As is the case in the second embodiment stated above, this module may be configured such that the end of the first coating member 26 on the rear surface side is exposed from the second coating member 36. Further, as shown, on the module's rear surface side, an adhesive 41 for bonding the first coating member 26 may be filled in a part which is formed by the difference in length between the front surface protective member 14 and the solar cell element 12. The present invention is applicable to such a configuration as well.

REFERENCE SIGNS LIST 1, 2, 3 solar cell module
10, 11 solar cell panel
12 solar cell element
14 front surface protective member
16 rear surface protective member
18 sealant layer
22, 24, 26 first coating member
32, 34, 36 second coating member
32a projections and recesses
32b projection
40, 41 adhesive
A1 the end of a first coating member on the front surface protective member side
A2, A3 the end of the first coating member on the rear surface protective member side
B1 the end of a second coating member on the front surface protective member side
B2, B3 the end of the second coating member on the rear surface protective member side
S1 the surface of a front surface protective member
S2 the surface of a rear surface protective member
S3 the side end surface of a solar cell panel
F frame
Fa first flange
Fb second flange
Fc third flange
Fd side wall

The invention claimed is:

1. A solar cell module comprising:
a solar cell panel comprising a solar cell element, a front surface protective member disposed on a light receiving surface side of the solar cell element, and a rear surface protective member disposed on a rear surface side of the solar cell element,
a first coating member having moisture resistance, the first coating member stuck to the solar cell panel with adhesive such that a surface of the front surface protective member, a side end surface of the solar cell panel, and a surface of the rear surface protective member are covered continuously at a peripheral edge of the solar cell panel, and
a second coating member covering a first end of the first coating member on the front surface protective member side and a second end of the first coating member on the rear surface protective member side, the second end being located between the side end surface of the solar cell panel and a center of the solar cell panel, the second end being in physical contact with the surface of the rear surface protective member, the second coating member being in physical contact with the surface of the front surface protective member and the surface of the rear surface protective member,
wherein the second coating member comprises a recess between a part where the second coating member is in physical contact with the surface of the front surface protective member and the first end of the first coating member,
wherein the recess is provided with an adhesive for sticking the second coating member to the solar cell panel, and
wherein the second coating member is a resin gasket.

2. The solar cell module according to claim 1, wherein projections and recesses are formed on an outer surface of the second coating member.

3. The solar cell module according to claim 1, wherein the first coating member is metal.

* * * * *